US007135886B2

(12) United States Patent
Schlacter

(10) Patent No.: US 7,135,886 B2
(45) Date of Patent: Nov. 14, 2006

(54) FIELD PROGRAMMABLE GATE ARRAYS USING BOTH VOLATILE AND NONVOLATILE MEMORY CELL PROPERTIES AND THEIR CONTROL

(75) Inventor: Guy Schlacter, Buffalo Grove, IL (US)

(73) Assignee: KLP International, Ltd., Santa Clara, CA (US)

( * ) Notice: Subject to any disclaimer, the term of this patent is extended or adjusted under 35 U.S.C. 154(b) by 93 days.

(21) Appl. No.: 10/944,978

(22) Filed: Sep. 20, 2004

(65) Prior Publication Data

US 2006/0062068 A1    Mar. 23, 2006

(51) Int. Cl.
H03K 19/173 (2006.01)
G11C 7/00 (2006.01)

(52) U.S. Cl. .......................... 326/38; 326/39; 365/226; 365/227; 365/185.04; 365/185.08; 365/185.33

(58) Field of Classification Search ................. 326/8, 326/38, 39; 365/185.01, 185.04, 185.08, 365/185.33

See application file for complete search history.

(56) References Cited

U.S. PATENT DOCUMENTS

| | | | |
|---|---|---|---|
| 3,634,929 A | 1/1972 | Yoshida et al. | |
| 4,322,822 A | 3/1982 | McPherson | |
| 4,488,262 A | 12/1984 | Basire et al. | |
| 4,490,900 A | 1/1985 | Chiu | |
| 4,502,208 A | 3/1985 | McPherson | |
| 4,507,757 A | 3/1985 | McElroy | |
| 4,543,594 A | 9/1985 | Mohsen et al. | |
| 4,546,273 A | 10/1985 | Osman | |
| 4,599,705 A | 7/1986 | Holmberg et al. | |
| 4,613,886 A | 9/1986 | Chwang | |
| 4,677,742 A | 7/1987 | Johnson | |
| 4,758,745 A | 7/1988 | El Gamal et al. | |
| 4,758,986 A | 7/1988 | Kuo | |
| 4,794,562 A | 12/1988 | Kato et al. | |
| 4,823,181 A | 4/1989 | Mohsen et al. | |
| 4,870,302 A | 9/1989 | Freeman | |
| 4,876,220 A | 10/1989 | Mohsen et al. | |
| 4,899,205 A | 2/1990 | Hamdy et al. | |
| 4,943,538 A | 7/1990 | Mohsen et al. | |
| 4,962,342 A | 10/1990 | Mead et al. | |
| 5,138,410 A | 8/1992 | Takebuchi | |

(Continued)

FOREIGN PATENT DOCUMENTS

EP    0 295 935    12/1988

(Continued)

OTHER PUBLICATIONS

U.S. Appl. No. 09/629,570, Bourassa et al.

(Continued)

*Primary Examiner*—Vibol Tan
(74) *Attorney, Agent, or Firm*—Perkins Coie LLP

(57) ABSTRACT

The embodiments of the present invention relate to the general area of Field Programmable Gate Arrays and, in particular, to Field Programmable Gate Arrays ("FPGAs") comprising memory cells with both volatile and nonvolatile properties, and the control and management of each portion to overcome the disadvantages of each individual technology. Some of the advantages of combining the two properties in a single FPGA are power reduction, shorter power-on time, configuration flexibility, instant-on logic capability, cost savings in system components including nonvolatile instant-on devices, configuration memories, and standard CMOS process. Furthermore, to optimize these and other advantages of the proposed architecture, additional apparatus and methods are presented to individually and collectively manage and control different parts of such hybrid FPGAs.

64 Claims, 4 Drawing Sheets

U.S. PATENT DOCUMENTS

| | | |
|---|---|---|
| 5,150,179 A | 9/1992 | Gill |
| 5,303,185 A | 4/1994 | Hazani |
| 5,304,871 A | 4/1994 | Dharmarajan et al. |
| 5,323,342 A | 6/1994 | Wada et al. |
| 5,412,244 A | 5/1995 | Hamdy et al. |
| 5,455,525 A | 10/1995 | Ho et al. |
| 5,477,499 A | 12/1995 | Van Buskirk et al. |
| 5,496,756 A | 3/1996 | Sharma et al. |
| 5,576,568 A | 11/1996 | Kowshik |
| 5,578,848 A | 11/1996 | Kwong et al. |
| 5,586,270 A | 12/1996 | Rotier et al. |
| 5,587,603 A | 12/1996 | Kowshik |
| 5,600,265 A | 2/1997 | El Gamal et al. |
| 5,650,336 A | 7/1997 | Eriguchi et al. |
| 5,675,541 A | 10/1997 | Leterrier |
| 5,675,547 A | 10/1997 | Koga |
| 5,745,417 A | 4/1998 | Kobayashi et al. |
| 5,781,032 A | 7/1998 | Bertolet et al. |
| 5,784,636 A | 7/1998 | Rupp |
| 5,825,200 A | 10/1998 | Kolze |
| 5,825,201 A | 10/1998 | Kolze |
| 5,880,512 A | 3/1999 | Gordon et al. |
| 5,889,411 A | 3/1999 | Chaudhary |
| 5,892,962 A | 4/1999 | Cloutier |
| 5,909,049 A | 6/1999 | McCollum |
| 5,929,482 A | 7/1999 | Kawakami |
| 5,949,712 A | 9/1999 | Rao et al. |
| 5,986,931 A | 11/1999 | Caywood |
| 5,986,939 A | 11/1999 | Yamada |
| 6,016,268 A | 1/2000 | Worley |
| 6,031,761 A | 2/2000 | Ghilardelli et al. |
| 6,034,893 A | 3/2000 | Mehta |
| 6,040,968 A | 3/2000 | Duvvury et al. |
| 6,044,012 A | 3/2000 | Rao et al. |
| 6,047,243 A | 4/2000 | Bang |
| 6,055,205 A | 4/2000 | Rao et al. |
| 6,064,225 A | 5/2000 | Andrews et al. |
| 6,064,595 A | 5/2000 | Logie et al. |
| 6,077,719 A | 6/2000 | Koike |
| 6,084,428 A | 7/2000 | Kolze et al. |
| 6,097,077 A | 8/2000 | Gordon et al. |
| 6,153,463 A | 11/2000 | Wei et al. |
| 6,157,568 A | 12/2000 | Schmidt |
| 6,166,954 A | 12/2000 | Chern |
| 6,177,830 B1 | 1/2001 | Rao |
| 6,198,652 B1 | 3/2001 | Kawakubo |
| 6,214,666 B1 | 4/2001 | Mehta |
| 6,215,140 B1 | 4/2001 | Reisinger et al. |
| 6,215,689 B1 * | 4/2001 | Chhor et al. .................. 365/63 |
| 6,218,274 B1 | 4/2001 | Komatsu |
| 6,232,631 B1 | 5/2001 | Schmidt et al. |
| 6,236,229 B1 | 5/2001 | Or-Bach |
| 6,249,809 B1 | 6/2001 | Bro |
| 6,282,123 B1 | 8/2001 | Mehta |
| 6,294,809 B1 | 9/2001 | Logie |
| 6,297,103 B1 | 10/2001 | Ahn et al. |
| 6,304,666 B1 | 10/2001 | Warren et al. |
| 6,337,250 B1 | 1/2002 | Furuhata |
| 6,351,428 B1 | 2/2002 | Forbes |
| 6,421,293 B1 | 7/2002 | Candelier et al. |
| 6,431,456 B1 | 8/2002 | Nishizawa et al. |
| 6,445,619 B1 | 9/2002 | Mihnea et al. |
| 6,456,535 B1 | 9/2002 | Forbes et al. |
| 6,459,634 B1 | 10/2002 | Sher |
| 6,476,636 B1 | 11/2002 | Lien et al. |
| 6,515,509 B1 | 2/2003 | Baxter |
| 6,556,481 B1 | 4/2003 | Hsu et al. |
| 6,594,192 B1 * | 7/2003 | McClure .................. 365/225.7 |
| 6,602,729 B1 | 8/2003 | Lin |
| 6,633,182 B1 | 10/2003 | Pileggi et al. |
| 6,650,143 B1 | 11/2003 | Peng |
| 6,674,670 B1 | 1/2004 | Jeung |
| 6,678,646 B1 | 1/2004 | McConnell et al. |
| 6,700,151 B1 | 3/2004 | Peng |
| 6,753,590 B1 | 6/2004 | Fifield et al. |
| 6,754,881 B1 | 6/2004 | Kuhlmann et al. |
| 6,777,757 B1 | 8/2004 | Peng et al. |
| 6,862,205 B1 | 3/2005 | Agata et al. |
| 2001/0003374 A1 | 6/2001 | Bohmer et al. |
| 2003/0218920 A1 | 11/2003 | Harari |
| 2005/0062497 A1 * | 3/2005 | Pellizzer et al. .............. 326/41 |

FOREIGN PATENT DOCUMENTS

JP        61292295        12/1986

OTHER PUBLICATIONS

Wu, E.W. et al; Voltage-Dependent Voltage-Acceleration of Oxide Breakdown for Ultra-Thin Oxides; IEEE, 2000, pp. 1-4, no month.

Sune, Jordi et al; Post Soft Breakdown Conduction in SiO2 Gate Oxides; IEEE, 2000, pp. 1-4, no month.

DeGraaf, C., et al, A Novel High-Density Low-Cost Diode Programmable Read Only Memory, IEEE, 1996, pp. 7.6.1-7.6.4, no month.

Rasras, Mahmoud et al; Substrate Hole Current Origin After Oxide Breakdown; IEEE, 2000, pp. 1-4, no month.

Lombardo, S. et al; Softening of Breakdown in Ultra-Thin Gate Oxide nMOSFET's at Low Inversion Layer Density; 39th Annual International Reliability Physics Symposium; Orlando, FL 2001, pp. 163-169, no month.

Miranda, Enrique et al; Analytic Modeling of Leakage Current Through Multiple Breakdown Paths in SiO2 Films; 39th Annual International Reliability Physics Symposium; Orlando, FL 2001, pp. 369-379, no month.

* cited by examiner

FIELD PROGRAMMABLE GATE ARRAYS USING BOTH VOLATILE AND NONVOLATILE MEMORY CELL PROPERTIES AND THEIR CONTROL

TECHNICAL FIELD

This invention relates to the field of programmable logic devices. In particular it relates to Field Programmable Gate Arrays (FPGAs) using both volatile and nonvolatile memory cell properties.

BACKGROUND

A digital logic circuit, generally formed as a cascade of separate logic functions, is a circuit that produces a digital output as a result of some logical operation on its digital inputs. Digital logic circuits are typically implemented on various types of integrated semiconductor chips. One widely known type of integrated chip is the Application Specific Integrated Circuit (ASIC), which is a custom-made integrated chip. Each ASIC is manufactured to implement a specific digital logic circuit.

Programmable Logic Devices (PLDs) are another type of integrated chip, but differ from ASICs because of their ability to implement any number of different complex digital logic circuits by configuring the underlying integrated chip. For implementing an end product, the programmable integrated chips are less costly, usually in a limited volume, than ASICs because a large volume of identical programmable integrated chips may be manufactured from a single design, which can later be configured to implement a wide variety of digital logic circuits for different end customers. Therefore, the cost of design and manufacturing is distributed over a large number of identical integrated chips that can implement a large number of end designs.

An FPGA is one type of PLD that can either be permanently or temporarily programmed by the user. Typically, an FPGA consists of an array of modularized logic units and interconnection resources, such as presented in U.S. patent application Ser. No. 60/578,597, filed Jun. 10, 2004. It is an array of uncommitted gates with uncommitted wiring channels. Each logic unit can be programmed to implement any particular logic function. Various digital circuits may be implemented to execute desired functions by configuring or programming a number of logic blocks and interconnecting them using programmable interconnection resources. A programmable gate array circuit can be programmed to implement virtually any set of functions.

A function is implemented in a PLD by setting the states of programmable elements such as memory cells that set the functionality of the circuit. These memory cells may be implemented with volatile memories, such as static random access memories (SRAMs), which lose their programmed states upon termination of power to the system, or with nonvolatile memories, such as erasable-programmable read only memories (EPROMs), Flash memories, or electrically erasable-programmable read only memories (EEPROMs), which retain their contents upon termination of power. If the programmable elements used are volatile memories, the memory cells must be reconfigured upon system power-up in order to restore the PLD to the desired programmed and functional state.

As integrated circuit technology and semiconductor processing continue to advance, there is a need for greater densities and functionality in integrated circuits, which are often determined in large part by the size of the memory cells used to create the circuit. Further, it is desirable that the memory cells have improved operating characteristics, such as lower power consumption, nonvolatility, greater device longevity, improved data retention, better transient performance, superior voltage and current attributes, and improvements in other similar attributes. Memory cells may be used to programmably control the composition, configuration, arrangements, and also the interconnections of logic array blocks and logic elements. Many different memory cell technologies may be used including DRAM, SRAM, EPROM, EEPROM, Flash, and antifuse, among others. Typically, an ideal technology for storing the configuration information of the PLD should be compact, power efficient, programmable, infinitely reprogrammable, infinitely reconfigurable, and nonvolatile, require little additional programming circuitry overhead and generally provide enhancements to the performance and features of PLD logic modules and interconnections.

The prior art and the present mainstream commercial FPGAs have either employed a volatile or a nonvolatile technology, each of which has its own disadvantages that cannot be overcome except by switching to the other technology. For example, in the case of a power interruption, the memory cells using volatile technology need their information to be restored and reconfigured; have a slower power-up time than the ones with nonvolatile technology; need a higher standby power; and typically require external intelligence for configuration. Likewise, the memory cells using nonvolatile technology are not infinitely reconfigurable, require nonstandard semiconductor processes, have a slow programming or "write" capability, and may not be testable during the manufacturing.

BRIEF DESCRIPTION OF THE DRAWINGS

The foregoing aspects and many of the attendant advantages of the invention will become more readily appreciated as the same become better understood by reference to the following detailed description, when taken in conjunction with the accompanying drawings, wherein.

DETAILED DESCRIPTION

Figure 1:
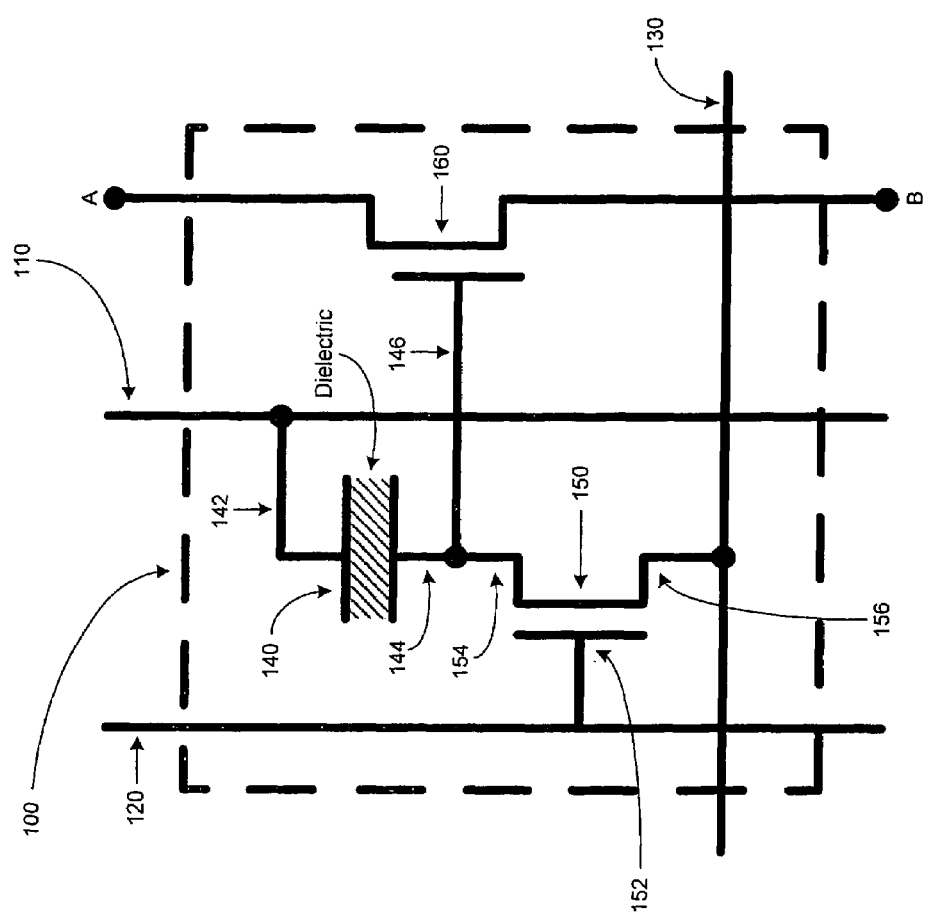
FIG. 1 is a schematic circuit diagram of a sample memory cell.

This invention relates to the field of programmable logic devices. In particular it discloses field programmable devices that employ both volatile and nonvolatile memory cell technologies, use a cell technology which exhibits volatile and nonvolatile properties, emulate volatile and nonvolatile memory cell properties, or a combination thereof. The embodiments of this invention also disclose apparatus and methods for the control and management of such field programmable devices. The prior art and the existing commercial FPGAs have either employed the volatile or the nonvolatile memory cell technology for the implementation of their circuits; however, each of these technologies has its own inherent disadvantages that are almost insurmountable except by switching to the other technology. The following table illustrates some of the advantages and disadvantages of two widely used volatile and nonvolatile cells.

| Technology | Advantages | Disadvantages |
| --- | --- | --- |
| Volatile SRAM Cell | Standard CMOS process Infinite reconfigurations Full testability during manufacturing | Needs configuration data Slow power up (100 s ms) Higher standby power (leaky) Typically requires external intelligence for configuration |
| Nonvolatile Fuse Cell or Flash | Instant on Low power (low leakage) Higher performance connections for switches (Fuse) Limited reprogrammability (Flash) | Not reconfigurable (Fuse; and limited for Flash) Nonstandard semiconductor process incurs cost penalties Very slow writes for programming or reconfiguration Not testable during manufacturing (Fuse) Older geometries (not as scalable as standard CMOS) create slower logic tiles for functionality |

To overcome the disadvantages of each individual technology, different embodiments of this invention illustrate how to combine and manage a field programmable device using either both technologies, a technology that exhibits both types of properties, or a combination thereof. In the detailed description of the embodiments described below, some of the advantages of combining the properties of the two technologies in a single FPGA are mentioned, such as power reduction, shorter power-on time, configuration flexibility, cost savings in system components including nonvolatile instant-on devices, configuration memories, and scaleable standard CMOS process. For example, the values representing the required configuration intelligence and/or information (intelligence or information or both), for any part of the array, can be stored in nonvolatile elements of a programmable array to instantly turn on any part of the array or to reconfigure any part of the array to its original configuration. Also, unlike the memory cells which employ technologies such as flash, antifuse, and EEPROM, some nonvolatile memory cells allow the secure storage of the configuration values, which prevents reverse engineering of the programmable array. Furthermore, to optimize these and other advantages of the proposed architecture, additional apparatus and methods are presented to individually and collectively manage and control different portions of such hybrid FPGAs.

In the following description, several specific details are presented to provide a thorough understanding of the embodiments of the invention. One skilled in the relevant art will recognize, however, that the invention can be practiced without one or more of the specific details, or in combination with other components, etc. In other instances, well-known implementations or operations are not shown or described in detail to avoid obscuring aspects of various embodiments of the invention.

The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this "Detailed Description" section.

Reference throughout the specification to "one embodiment" or "an embodiment" means that a particular feature, structure, implementation, or characteristic described in connection with the embodiment is included in at least one embodiment of the present invention. Thus, the phrases "in one embodiment" or "in an embodiment" in various places throughout the specification do not necessarily all refer to the same embodiment. Furthermore, the particular features, structures, implementations, or characteristics may be combined in any suitable manner in one or more embodiments. FIG. 1 is a schematic circuit diagram of a sample memory cell 100, previously disclosed in U.S. Pat. No. 6,650,143, issued to Jack Zezhong Peng, incorporated herein by reference. The memory cell 100 is merely presented as an example, and may exhibit volatile, nonvolatile, or both properties. Different configurations of the memory cell 100 and their associated properties are briefly discussed in the following paragraphs.

The memory cell 100 comprises a column bitline 110, a read bitline 120, and a row wordline 130. The memory cell 100 also comprises a capacitor 140 having a first terminal 142 and a second terminal 144, where the first terminal 142 is connected to the column bitline 110 and the second terminal 144 is connected to a switch control node 146. The capacitor 140 further comprises a dielectric between its first and second terminals. The memory cell 100 also includes a select transistor 150 having a gate 152, a source 154, and a drain 156, where the gate 152 is connected to the read bitline 120, the source 154 to the switch control node 146, and the drain 156 to the row wordline 130. Finally the memory cell 100 is attached to an optional logic switch 160, which is being controlled by the switch control node 146 and can electrically connect point A to point B.

The configuration of the memory cell 100 and the subsequent control of the logic switch 160 can be achieved by a sequence of appropriately timed voltage settings on the column bitline 110, the read bitline 120, and the row wordline 130. As will be described below, an FPGA may include a combination of volatile, nonvolatile, or hybrid versions of such memory cells to optimize different aspects of its manufacturing and performance. It will be appreciated that the voltages mentioned in the following examples are illustrative, and that different voltages are likely to be used in different applications or when different process technologies are used.

The use of memory cells, such as the one in FIG. 1, as programmed elements, is advantageous because the components can be fabricated using many conventional CMOS processes with only a single polysilicon deposition step, and without adding any mask steps to them. This is in contrast to "floating gate" type FPGA flash memory, which requires at least two polysilicon layers. This is also in contrast to the anti-fuse type FPGA, which requires special process steps. Furthermore, with modern technological advances, the size of a capacitor and transistor can be made very small, which greatly increases the density of the FPGA.

Breaking down the capacitor 140 in FIG. 1, by exerting a relatively large voltage across it, will create a nonvolatile memory cell that remembers its programmed value at the switch control node 146, any time the power is turned on. This can be achieved by, for example, having 8 volts on the column bitline 110, 0 volt on the row wordline 130, and 3.3 volts on the read bitline 120. This voltage combination turns on the select transistor 150 which causes the capacitor 140 to be subjected to 8 volts across its terminals 142 and 144. The gate oxide of the capacitor 140 is designed to break down at this potential difference, which programs the FPGA cell 100. When the oxide of the capacitor 140 breaks down the physical characteristics of the cell 100 is changed. In particular, the capacitor 140 becomes mainly a resistive diode like element with a slight capacitance left.

On the other hand, if the cell 100 has not been programmed and the capacitor 140 is intact, the memory cell 100 will act as a volatile memory and behave as a DRAM. The operation of the cell 100 is different when it is used as a volatile memory. For example in a "write" process, a 0 volt is stored at node 146 by placing 8 volts on the column bitline 110, 0 volt on the row wordline 130, and by momentarily placing 3.3 volts on the read bitline 120 to turn on the select transistor 150. Similarly, a 3.3 volt potential can be stored at node 146 by placing 8 volts on the column bitline 110, 3.3 volts on the row wordline 130, and by momentarily placing 3.3 volts on the read bitline 120 to turn on the select transistor 150. Note that the select transistor 150 should be "on" long enough to achieve the desired voltage at node 146. In this volatile configuration the cell 100 is capable of infinite write cycles; however, the node 146 requires refreshing.

In effect for this memory cell 100 or similar memory cells, the series combination of the capacitor 140 and transistor 150 form a voltage divider whose middle node is connected to the gate of the logic switch 160. Depending on whether the capacitor 140 is broken or not and whether the select transistor 150 is on or off the gate of the logic switch 160 can be controlled to be permanently at a single value or temporarily at the same or a different voltage value.

It is important to notice that even after the capacitor 140 is broken down and turned mainly into a resistor, it retains some capacitance which enables the cell 100 to store different charges at node 146 and act as a volatile, multiple write, memory cell similar to the one described above. However, the timing of the refreshing cycles may change because of the change in the time constant of the broken-down capacitor 140. Therefore, while the memory cell 100 is programmed as a nonvolatile memory cell to retain a permanent value in case of a power-off, it can be used as a volatile multiple write memory cell, if desired.

Figure 2:
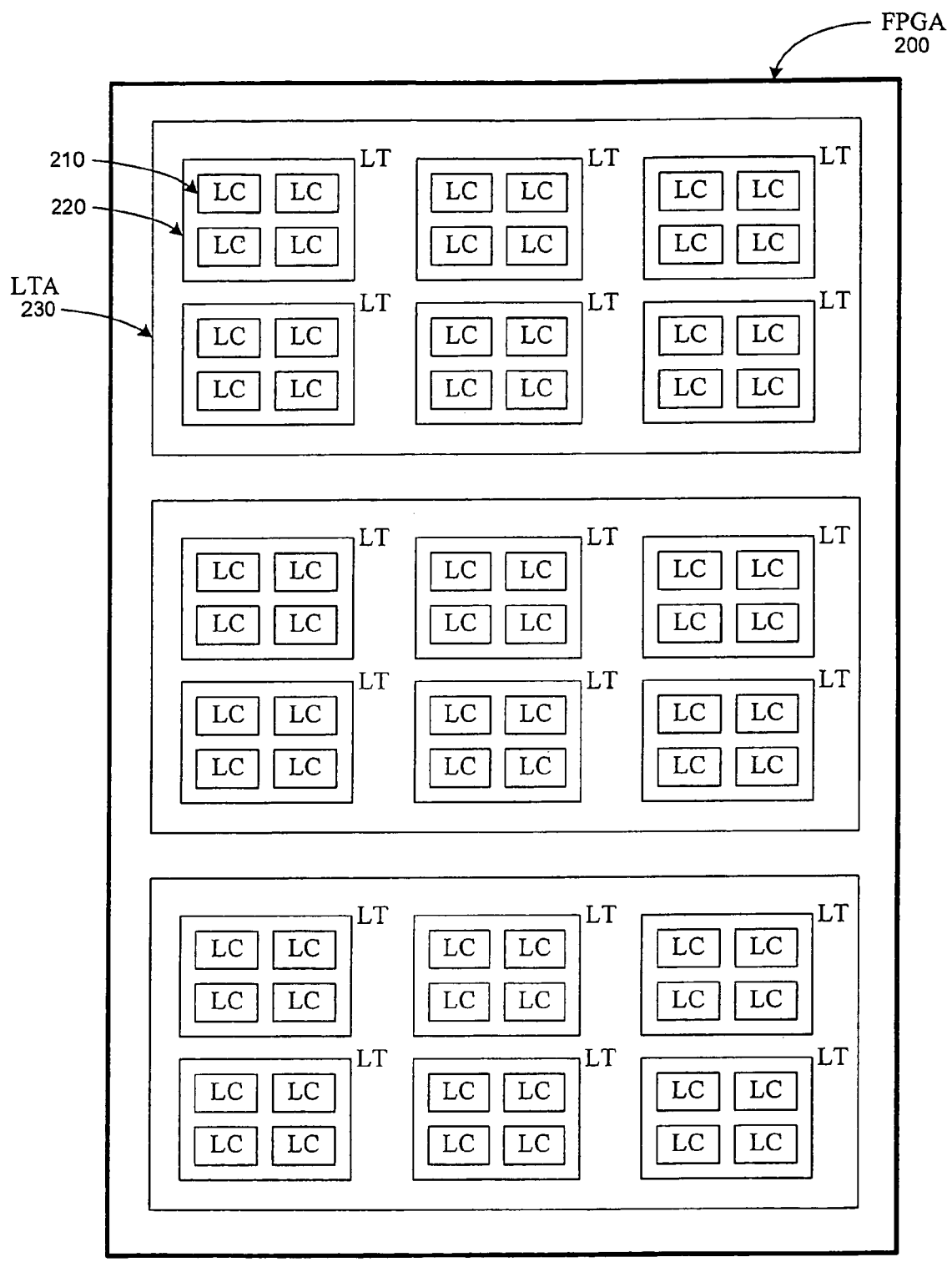
FIG. 2 is a simplified block diagram of a typical FPGA.

FIG. 2 is a simplified block diagram of a typical FPGA. The architecture of a conventional FPGA 200, for several advantageous reasons, is based on the modularization and replication of a primary logic unit, called a logic cell (LC) 210. A logic cell 210 is a combination of logic and memory elements that can be controlled and configured to perform various logic functions, wherein the memory elements themselves can be configured to act as logic elements and/or help sequentialize the logic functions. The word "cell," when used alone, refers to either a pure memory cell or a logic cell that comprises a memory cell.

Furthermore, a number of logic cells are locally connected to form a larger building block for an FPGA, which is hereinafter referred to as a logic tile (LT) 220. Tiles are not limited to those composed of logic cells; other functional tiles may exist such as memory blocks, multiplier blocks, or ALU blocks, which are also referred to as logic tiles hereinafter. A logic tile, while saving global routing tracks by using mostly local connections between its logic cells, performs more complicated logic functions than an individual logic cell. Similarly, logic tile arrays (LTAs) 230, which are larger building blocks than logic tiles, are formed by connecting multiple logic tiles.

Clearly, a logic tile array has more functional capabilities than an individual logic tile. An FPGA is a further combination of several of such logic tile arrays. In the embodiments of this invention some logic tile arrays of an FPGA use nonvolatile memory cell properties and are programmed as such, some logic tile arrays use volatile or multiple-write memory cell properties and are programmed accordingly, and some logic tiles may use both sets of properties. Note that, throughout this application, the word "nonvolatile" does not exclude "multiple-write" capability, and a nonvolatile memory can be either a single-write memory or a multiple-write memory.

In the following paragraphs, different embodiments of the invention will set forth examples of how volatile and/or nonvolatile logic tile arrays of a hybrid FPGA can be arranged and controlled to optimize functionality and manufacturing aspects of the FPGA. Based on these examples, and the associated figures, a person of ordinary skill in the relevant art will be able to program and configure such hybrid circuits and manage their volatile and nonvolatile behaving portions to perform desired functions while optimizing several aspects of their manufacturing and performance.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in "Detailed Description" section using the singular or plural number may also include the plural or singular number, respectively. When the claims use the word "or" in reference to a list of two or more items, that word covers all of the following interpretations of the word: any of the items in the list, all of the items in the list, and any combination of the items in the list.

Figure 3:
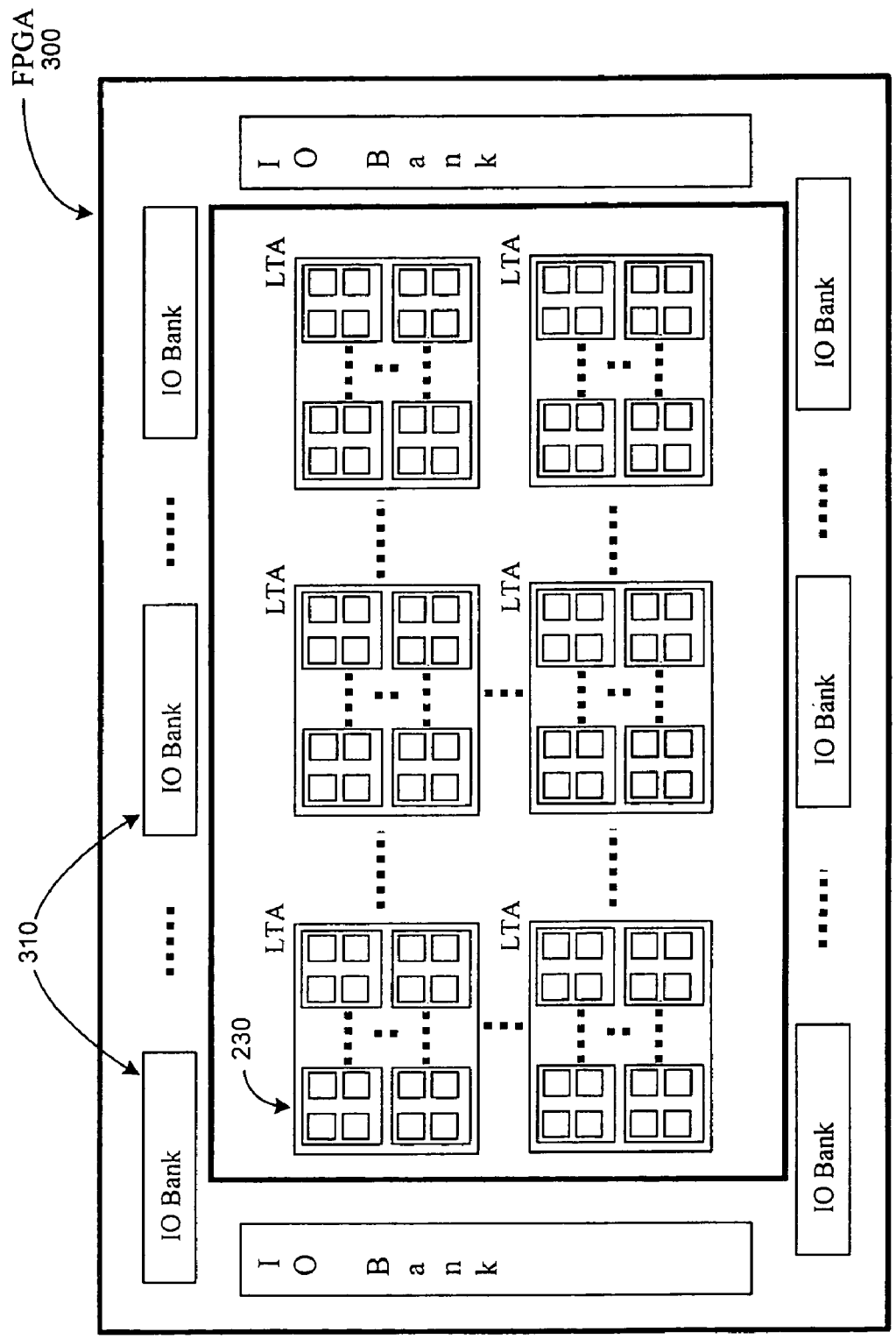
FIG. 3 is a block diagram of an FPGA, in accordance with an embodiment of the invention.

FIG. 3 is a block diagram of an FPGA 300, in accordance with an embodiment of the invention. In this embodiment, some of the logic tile arrays 230 can have volatile properties, some can have nonvolatile properties, and the remaining logic tile arrays can have both. This arrangement provides significant diversity and flexibility to the user for programming, configuration, and power saving. For example, while powering up a volatile FPGA requires external intelligence for reconfiguration of memory cells, a hybrid FPGA can use its nonvolatile portions to reconfigure its volatile parts. Or since some of the characteristics of the volatile and the nonvolatile cells are different, such as their standby power consumption, their power-up time, and their "write" time, the volatile portion of a hybrid FPGA may be managed differently from the nonvolatile portion. For example, the power to the volatile portion of the hybrid FPGA may be turned off while the power to the nonvolatile portion remains on, or vice versa.

In another embodiment of the invention, the user can turn on and off every individual logic tile or logic tile array 230, partly or in its entirety. Such flexibility is helpful in particular to the users of battery-operated devices. The user of such devices, by turning off the volatile or the nonvolatile portion of the device, can leave a part of the device awake while the rest of the device is in a sleep mode, and avoid leakage and/or active power consumption. A subsequent wake-up signal can instantly turn on and configure the sleeping part of the FPGA to run a desired function. In yet another embodiment of the invention, the same power control capability can be provided to the user to turn the power of the Input/output Banks (I/O Banks) 310 off or on.

Figure 4:
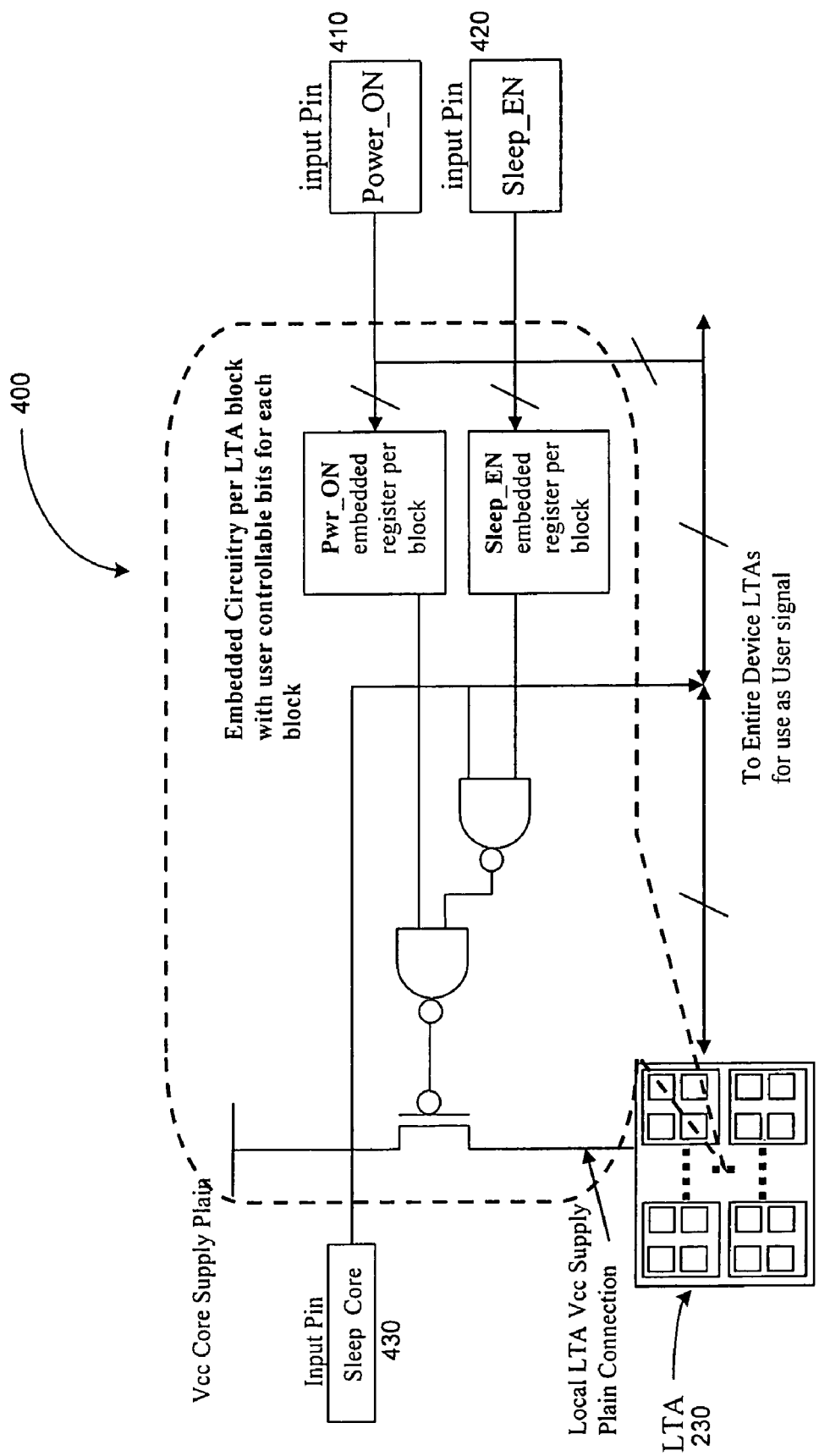
FIG. 4 is a block diagram of an embedded control circuit for the management of power, in accordance with yet another embodiment of the invention.

FIG. 4 is a block diagram of a sample embedded control circuit 400 for the management of the power to a logic tile array 230, in accordance with yet another embodiment of the invention. A similar circuit may be employed to manage the power to an I/O Bank 310 of an FPGA. Each circuit 400 receives three 1-bit inputs. Two of these input bits are specific to the logic tile array 230 that is to be controlled, or the I/O Bank, whereas the third input is a global signal.

According to this embodiment, there is an input signal 410, called Power_ON, for each individual logic tile array 230, each I/O Bank 310, or logic tile 220, which can be used by a user to directly approach the logic tile array 230 or the I/O Bank 310 or logic tile 220 and put it to sleep. Similarly, there can be an input signal 420 for each individual logic tile array 230, I/O Bank 310 or Logic Tile 220, which is called Sleep_EN and works in collaboration with the global input signal 430. The Sleep_EN input signal 420 singles out and enables a specific logic tile array 230, or a specific I/O Bank 310 or specific logic tile 220, to go to sleep once the global signal 430, called Sleep_Core, arrives. In this way, instead of using the Power_ON lines to individually put a number of logic tile arrays, logic tiles and/or I/O Banks to sleep, a user can enable those logic tile arrays and/or I/O Banks that must go to sleep, and later, at any desired time, send a global sleep signal to put all of them to sleep. The user can use the same global signal to awaken them as well. These facilities are not restricted to exploitation by the user. Different elements of a programmable array can be enabled for sleep by other elements of the array as well. And such configurations may later be reconfigured by yet other users and/or elements.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily to the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless this "Detailed Description" section explicitly defines such terms. Accordingly, the actual scope of the invention encompasses not only the disclosed embodiments, but also all equivalent ways of practicing or implementing the invention under the claims.

While certain aspects of the invention are presented below in certain claim forms, the inventors contemplate the various aspects of the invention in any number of claim forms. For example, while only one aspect of the invention is recited as embodied in a computer-readable medium, other aspects may likewise be embodied in a computer-readable medium. Accordingly, the inventors reserve the right to add additional claims after filing the application to pursue such additional claim forms for other aspects of the invention.

I claim:

1. A field programmable gate array configured to receive power, comprising:
   a first portion including volatile memory cells, wherein the volatile memory cells require configuration values upon turning on the power;
   a second portion including nonvolatile memory cells, wherein the nonvolatile memory cells are capable of storing at least a part of the configuration values required by the volatile memory cells, and wherein upon turning on the power the second portion will provide at least a part of the required configuration values required by the volatile memory cells;
   at least one input/output bank comprising an input/out port; and
   a power control circuit, whereby the power to at least one part of the gate array including the at least one input/output bank, the first portion of the gate array, or the second portion of the gate array can be individually and independently turned off or on, and wherein the power control circuit can either directly turn any of the said at least one parts off or on or can program or enable any of the said at least one parts to be turned off or on upon receiving a global on/off signal.

2. The field programmable gate array of claim 1, wherein turning off or turning on the power to the entire gate array or to any portion of the gate array is user controllable.

3. The field programmable gate array of claim 1, wherein the configuration values resident in the second portion cause at least a part of the gate array, comprising both volatile and nonvolatile cells, to be instantly on after a power-up.

4. The field programmable gate array of claim 1, wherein the configuration values residing in the nonvolatile memory cells of the second portion enable at least a part of the gate array to be reconfigured to its original configuration while the power remains on.

5. The field programmable gate array of claim 1, wherein a fabrication process of the field programmable gate array is the scaleable standard CMOS process.

6. The field programmable gate array of claim 1, wherein to provide security against reverse engineering of the gate array, a multiplicity of the nonvolatile memory cells utilize non-floating gate (flash), non-antifuse, and non-EEPROM technology to securely store configuration data.

7. The field programmable gate array of claim 6, wherein the field programmable gate array is capable of using either nonsecure or the secure configuration data.

8. A programmable device, comprising:
   a power control facility;
   a first portion including memory cells that exhibit volatile properties and require configuration values upon power-up, wherein the power to the first portion of the device can be independently turned off or on by the power control facility; and
   a second portion including memory cells that exhibit nonvolatile properties and are capable of storing at least a portion of the configuration values required by the first portion of the device, wherein the power to the second portion of the device can be independently turned off or on by the power control facility, and wherein upon turning the power on to the first portion of the device the second portion provides at least a part of the configuration values required by the first portion.

9. The programmable device of claim 8, wherein to provide security against reverse engineering of the devise, a multiplicity of the memory cells exhibiting nonvolatile properties utilize non-floating gate (flash), non-antifuse, and non-EEPROM technology to securely store configuration data.

10. The programmable device of claim 9, wherein the device is capable of using either nonsecure or the secure configuration data.

11. The programmable device of claim 8, wherein the configuration values resident in the second portion cause at least a part of the device to be instantly on after a power-up.

12. The programmable device of claim 8, wherein turning off or turning on the power to the entire device or to any portion of the device is user controllable.

13. The programmable device of claim 8, where the power control facility comprises:
 a means for directly and independently turning off or turning on the power to the first portion or to the second portion or to both portions of the device; and
 a means for programming or enabling either or both portions of the device to be turned off or turned on upon receiving a global on/off signal.

14. The programmable device of claim 8, wherein upon the restoration of the power to a part of the device, such as the first or the second portion of the device, the device is at least partially reconfigured by the configuration values residing in the second portion of the device, or by a user provided configuration values, or by both, and wherein the residing configuration values of the second portion are required intelligence and/or information for configuring the first portion of the device.

15. The programmable device of claim 8, wherein the programmable device is a field programmable gate array.

16. The programmable device of claim 8, wherein a fabrication process of the device is the scaleable standard CMOS process.

17. A field programmable device configured to receive power, comprising:
 a first portion comprising a memory cell with volatile properties;
 a second portion comprising a memory cell with nonvolatile properties;
 at least one input/output bank comprising an input/out port; and
 a power control facility, wherein the facility separately and individually controls the supply of power to at least one part of the device including any of the at least one input/output banks, the first portion of the device, or the second portion of the device.

18. The field programmable device of claim 17, wherein to provide security against reverse engineering of the devise, a multiplicity of the memory cells with nonvolatile properties utilize non-floating gate (flash), non-antifuse, and non-EEPROM technology to securely store configuration data, and wherein the field programmable device is capable of using either nonsecure or the secure configuration data.

19. The field programmable device of claim 17, wherein turning off or turning on the power to the entire device or to any of the said at least one parts of the device is user controllable.

20. The field programmable device of claim 17, where the power control facility comprises:

a means for directly and independently turning off or turning on the power to the entire device or to any of the said at least one parts of the device; and
 a means for programming or enabling any of the said at least one parts of the device, to be turned off or on upon receiving a global signal.

21. The field programmable device of claim 17, wherein the field programmable device is a field programmable logic array.

22. The field programmable device of claim 17, wherein the second portion of the device is capable of providing intelligence and/or information required for at least partially reconfiguring any of the said at least one parts of the device, including the first portion of the device, upon restoration of the power to the device or to any of the said at least one parts of the device.

23. The field programmable device of claim 17, wherein the second portion of the device is capable of providing intelligence and/or information required for turning the device, or any of the said at least one parts of the device, instantly on.

24. The field programmable device of claim 17, wherein a fabrication process of the device is the scaleable standard CMOS process.

25. The field programmable device of claim 17, wherein a multiplicity of the memory cells with nonvolatile properties are also capable of being configured as volatile memory cells, which enables testing of the circuit connections prior to programming the cells.

26. A field programmable device configured to receive power, comprising:
 a hybrid portion further comprising cells exhibiting both volatile and nonvolatile memory properties, wherein the hybrid portion is capable of storing at least a part of configuration values required by at least one part of the device, such as the hybrid portion itself;
 at least one input/out bank comprising an input/out port, and
 a power control facility, wherein the supply of power to any of the at least one parts of the device, such as to any of the at least one input/output banks or to the hybrid portion, is controlled separately and individually.

27. The field programmable device of claim 26, wherein to provide security against reverse engineering of the devise, a multiplicity of the cells exhibiting both volatile and nonvolatile memory properties utilize non-floating gate (flash, non-antifuse, and non-EEPROM technology to securely store configuration data.

28. The field programmable device of claim 27, wherein the field programmable device is capable of using either nonsecure or the secure configuration data.

29. The field programmable device of claim 26, wherein turning off or turning on the power to any of the said at least one parts of the device is user controllable.

30. The field programmable device of claim 26, where the power control facility comprises:
 a means for directly and independently turning off or turning on the power to any of the said at least one parts of the device such as the hybrid portion or any of the at least one input/output banks; and
 a means for programming any of the said at least one parts of the device such as the hybrid portion or any of the at least one input/output banks to be turned off or on upon receiving a global signal.

31. The field programmable device of claim 26, wherein the field programmable device is fabricated utilizing a semiconductor fabrication process.

32. The field programmable device of claim 26, wherein the volatile properties of the cells permit testing of the circuit connections prior to programming the cells.

33. A field programmable logic array configured to receive power, comprising:
- a hybrid portion including cells which exhibit both volatile and nonvolatile memory properties, wherein a multiplicity of the cells permanently retain intelligence and/or information to, at least partially, control and configure the logic array or a part of the logic array upon restoration of power, or to reconfigure the logic array or a part of the logic array to its original configuration while the power continues to be on, and wherein to provide security against reverse engineering of the logic array a multiplicity of the cells exhibiting both volatile and nonvolatile properties utilize non-floating gate (flash), non-antifuse, and non-EEPROM technology to securely store configuration data.

34. The field programmable logic array of claim 33, wherein the field programmable logic array is capable of using either nonsecure or the secure configuration data.

35. The field programmable logic array of claim 33, wherein a part of the intelligence and/or information for configuring the logic array or a part of the logic array is provided by a user.

36. A field programmable gate array, configured to receive power, comprising:
- at least one input/output bank further comprising an input/output port;
- at least two logic tile arrays, wherein each logic tile array comprises at least two logic tiles and each logic tile further comprises at least two logic cells, and wherein at least one logic tile uses hybrid cells exhibiting both volatile and nonvolatile memory properties, and a multiplicity of the hybrid cells permanently retain intelligence and/or information to, at least partially, control and configure the gate array or a part of the gate array upon restoration of power, or to reconfigure the gate array or a part of the gate array to its original configuration while the power continues to be on; and
- a power control facility, wherein the power control facility separately and individually controls the supply of power to any of the at least one input/output banks, to any logic tile, and to any logic tile array.

37. The field programmable gate array of claim 36, wherein to provide security against reverse engineering of the gate array, a multiplicity of the hybrid cells utilize non-floating gate (flash), non-antifuse, and non-EEPROM technology to securely store configuration data.

38. The field programmable gate array of claim 37, wherein the field programmable gate array is capable of using either nonsecure or the secure configuration data.

39. The field programmable gate array of claim 36, wherein supply of the power is user controllable.

40. The field programmable gate array of claim 36, where the power control circuit comprises:
- a means for turning off or turning on the power to any of the logic tiles, logic tile arrays, or to any of the at least one input/output banks; and
- a means for programming or enabling any of the logic tiles, logic tile arrays, or any of the at least one input/output banks to be turned off or on upon receiving a global signal.

41. The field programmable gate array of claim 36, wherein the hybrid cells, prior to programming the cells, make testing of the circuit connections possible.

42. The field programmable gate array of claim 36, wherein at least a part of the required intelligence and/or information for configuring any part of the array resides in the hybrid cells of at least one logic tile, and wherein the field programmable gate array is instantly turned on, at least partially, utilizing the said resident intelligence and/or information.

43. The field programmable gate array of claim 36, wherein at least a part of the required intelligence and/or information for configuring any part of the array resides in the hybrid cells of at least one logic tile, and wherein the field programmable gate array is, at least partially, configured by the resident intelligence and/or information upon power-up or reconfigured to its original configuration while the power is on.

44. The field programmable gate array of claim 36, wherein the field programmable gate array is fabricated utilizing a semiconductor process.

45. The field programmable gate array of claim 36, wherein a separate signal is dedicated to at least one logic tile array to directly and individually turn its power on or off.

46. The field programmable gate array of claim 36, wherein a separate signal is dedicated to at least one logic tile to directly and individually turn its power on or off.

47. The field programmable gate array of claim 36, wherein a one-bit signal is dedicated to at least one logic tile array to directly and individually turn its power on or off.

48. The field programmable gate array of claim 36, wherein a one-bit signal is dedicated to at least one logic tile to directly and individually turn its power on or off.

49. The field programmable gate array of claim 36, wherein a separate signal is dedicated to at least one logic tile array to program or enable the logic tile array to be turned on or off upon receiving a global control signal.

50. The field programmable gate array of claim 36, wherein a separate signal is dedicated to at least one logic tile to program or enable the logic tile to be turned on or off upon receiving a global control signal.

51. The field programmable gate array of claim 36, wherein a one-bit signal is dedicated to each logic tile array to program or enable the logic tile array to be turned on or off upon receiving a one-bit global control signal.

52. The field programmable gate array of claim 36, wherein a one-bit signal is dedicated to each logic tile to program or enable the logic tile to be turned on or off upon receiving a one-bit global control signal.

53. A field programmable device configured to receive power, comprising hybrid cells each of which exhibits both volatile and nonvolatile memory properties, wherein at least one of the hybrid cells stores intelligence and/or information required for reconfiguration of at least one part of the device upon turning on the power to that portion, or for reconfiguration of the at least one part of the device to its original configuration while the power is on, and wherein the device can be at least partially reconfigured by the resident intelligence and/or information, by a user-provided intelligence and/or information, or by both.

54. The field programmable device of claim 53, wherein to provide security against reverse engineering of the device, a multiplicity of the hybrid cells utilize non-floating gate (flash), non-antifuse, and non-EEPROM technology to securely store configuration data, and wherein the field programmable device is capable of using either nonsecure or the secure configuration data.

55. The field programmable device of claim 53, wherein the power to any of the at least one parts of the device can be individually and independently turned off or on.

56. The field programmable device of claim 53, wherein the supply of power to any of the at least one parts of the device is user controllable.

57. The field programmable device of claim 53, further comprising a means for turning off or turning on the power to any of the at least one parts of the device, individually and independently, wherein a user or any of the at least one parts of the device can either directly turn one of the at least one parts of the device off or on, or can program or enable one of the at least one parts of the device to be turned off or on upon receiving a global control signal.

58. The field programmable device of claim 53, wherein the field programmable device is fabricated utilizing a semiconductor process.

59. A field programmable gate array configured to receive power, comprising:
- at least one input/output bank further comprising an input/output port;
- at least two logic tile arrays, each logic tile array comprising at least two logic tiles, each logic tile further comprising at least two logic cells, where at least one logic tile array uses hybrid cells exhibiting both volatile and nonvolatile memory properties, and wherein a part of required intelligence and/or information for configuring at least a part of the device resides in at least one of the logic tile arrays with hybrid cells; and
- a means for individually and independently turning off or turning on the power to any of the at least one input/output banks, any logic tile, or any logic tile array.

60. A field programmable gate array configured to receive power, comprising:
- a first portion including volatile memory cells, wherein the volatile memory cells require configuration values; and
- a second portion including nonvolatile memory cells, wherein the nonvolatile memory cells are capable of storing at least a part of the configuration values required by the volatile memory cells, and upon turning on the power the second portion will provide at least a part of the required configuration values required by the volatile memory cells, and wherein the configuration values residing in the nonvolatile memory cells of the second portion is capable of reconfiguring at least a part of the gate array to its original configuration while the power remains on.

61. A field programmable gate array, comprising a multiplicity of nonvolatile memory cells, wherein to provide security against reverse engineering of the gate array, the multiplicity of nonvolatile memory cells utilize non-floating gate (flash), non-antifuse, and non-EEPROM technology to securely store configuration data, and wherein the gate array is capable of using either nonsecure or the secure configuration data.

62. A programmable device, configured to receive power, comprising:
- a power control facility;
- a first portion including memory cells that exhibit volatile properties and require configuration values, wherein the power to the first portion of the device can be independently turned off or on by a user or by the power control facility; and
- a second portion including memory cells that exhibit nonvolatile properties and are capable of storing at least a portion of the configuration values required by the first portion of the device, wherein the power to the second portion of the device can be independently turned off or on by the user or by the power control facility, and wherein upon turning the power on to the first portion of the device the second portion provides at least a part of the configuration values required by the first portion.

63. A field programmable gate array, configured to receive power, comprising:
- at least one input/output bank further comprising an input/output port; and
- at least two logic tile arrays, wherein each logic tile array comprises at least two logic tiles and each logic tile further comprises at least two logic cells, and wherein at least one logic tile uses hybrid cells exhibiting both volatile and nonvolatile memory properties, and a multiplicity of the hybrid cells permanently retain intelligence and/or information to, at least partially, control and configure the gate array or a part of the gate array upon restoration of power, or to reconfigure the gate array or a part of the gate array to its original configuration while the power continues to be on.

64. A field programmable device, comprising:
- a hybrid portion further comprising cells exhibiting both volatile and nonvolatile memory properties, wherein the hybrid portion is capable of storing at least a part of configuration values required by at least one part of the device, such as the hybrid portion itself, and is capable of providing the stored configuration values to the at least one part of the device, and wherein the cells exhibiting nonvolatile memory properties utilize non-floating gate (flash), non-antifuse, and non-EEPROM technology.

* * * * *